(12) United States Patent
Schröder et al.

(10) Patent No.: US 7,058,851 B2
(45) Date of Patent: Jun. 6, 2006

(54) INTEGRATED MEMORY AND METHOD OF REPAIRING AN INTEGRATED MEMORY

(75) Inventors: Stephan Schröder, München (DE); Wolfgang Helfer, München (DE); Arndt Gruber, München (DE)

(73) Assignee: Infineon Technologies AG, Munich (DE)

( * ) Notice: Subject to any disclaimer, the term of this patent is extended or adjusted under 35 U.S.C. 154(b) by 553 days.

(21) Appl. No.: 10/304,135

(22) Filed: Nov. 25, 2002

(65) Prior Publication Data

US 2003/0101370 A1 May 29, 2003

(30) Foreign Application Priority Data

Nov. 23, 2001 (DE) .................... 101 57 537

(51) Int. Cl.
*G06F 11/00* (2006.01)

(52) U.S. Cl. .................... 714/6; 714/7; 714/8; 714/710; 714/718; 365/200; 365/201

(58) Field of Classification Search .................... 714/6, 714/7, 8, 710, 718; 365/200, 201
See application file for complete search history.

(56) References Cited

U.S. PATENT DOCUMENTS

| 4,653,050 | A | * | 3/1987 | Vaillancourt ................... 714/8 |
| 5,491,664 | A | * | 2/1996 | Phelan ........................ 365/200 |
| 5,703,817 | A | * | 12/1997 | Shiratake et al. ........... 365/200 |
| 5,831,914 | A | | 11/1998 | Kirihata |
| 5,940,335 | A | * | 8/1999 | Kirihata ....................... 365/200 |
| 6,101,138 | A | * | 8/2000 | Shiah et al. ................. 365/200 |
| 6,687,171 | B1 | * | 2/2004 | Rehm et al. ................. 365/200 |
| 6,856,561 | B1 | * | 2/2005 | Kato et al. .................. 365/200 |
| 6,879,530 | B1 | * | 4/2005 | Callaway et al. ........... 365/201 |

* cited by examiner

*Primary Examiner*—Bryce P. Bonzo
*Assistant Examiner*—Emerson Puente
(74) *Attorney, Agent, or Firm*—Laurence A. Greenberg; Werner H. Stemer; Ralph E. Locher

(57) ABSTRACT

A method for repairing an integrated memory having first units of memory cells and second, redundant units of memory cells for replacing first units of memory cells. The first units of memory cells are tested with regard to their functionality. In the case of a defect ascertained in one of the first units, a number of redundant units is programmed as an associated cluster for replacing one or more of the first units. In this way, a repair element is formed with a cluster size corresponding to the number of redundant units. The cluster size of respective repair elements is set in a variable manner by a redundancy circuit. As a result, in a test and repair operation, a comparatively short test time of the memory is made possible in conjunction with a yield that remains good.

12 Claims, 4 Drawing Sheets

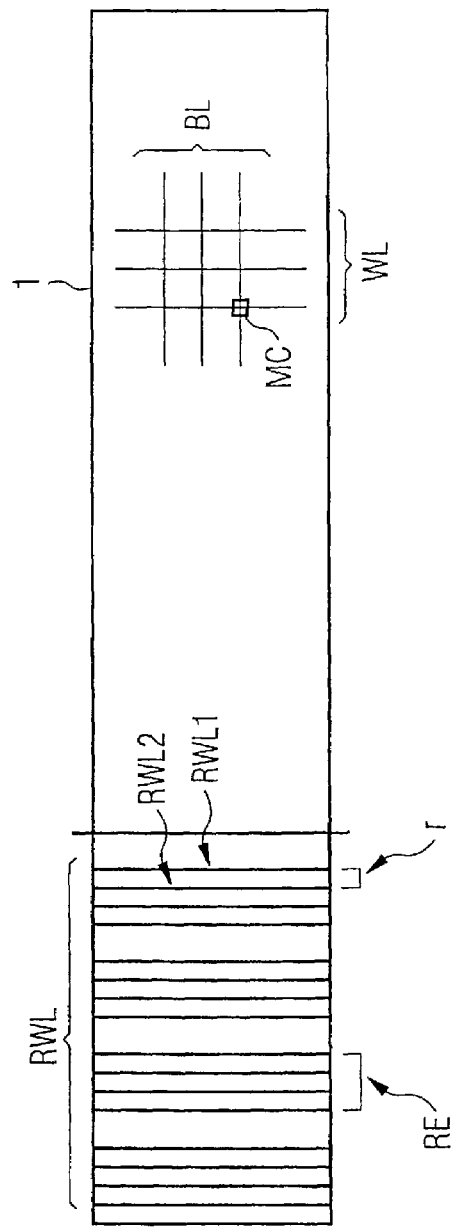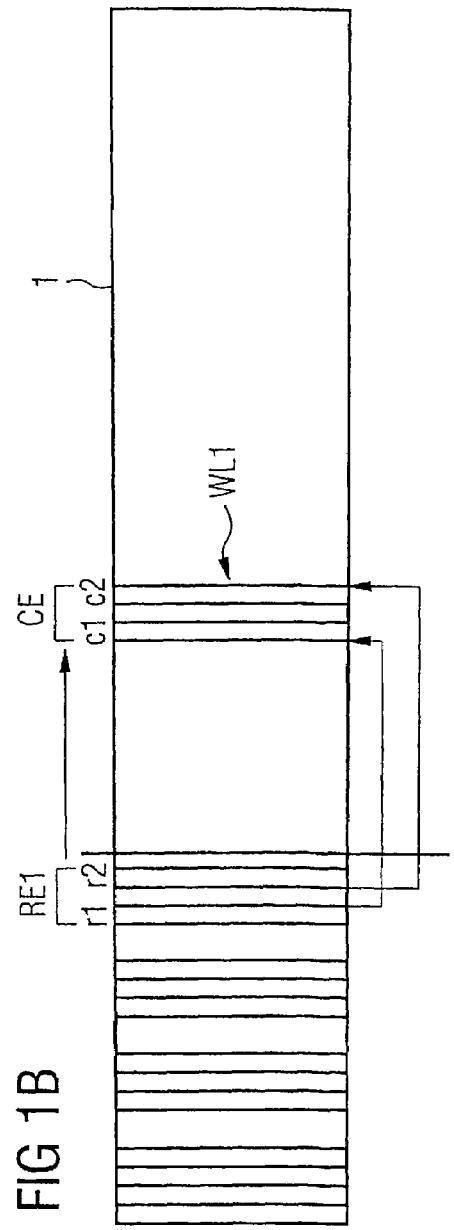

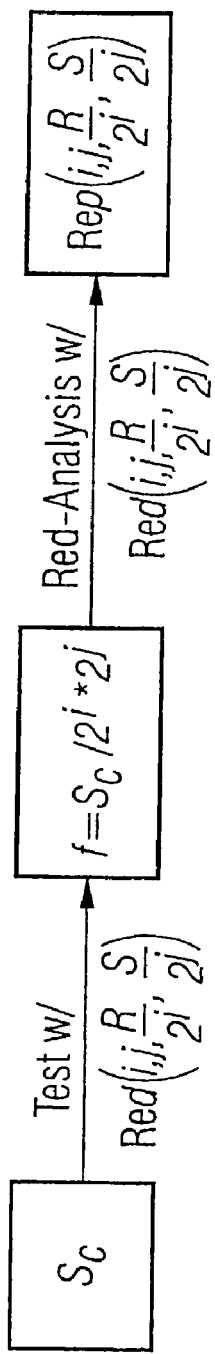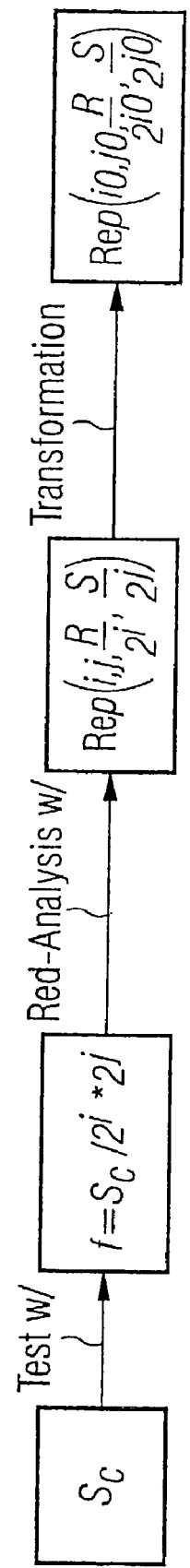

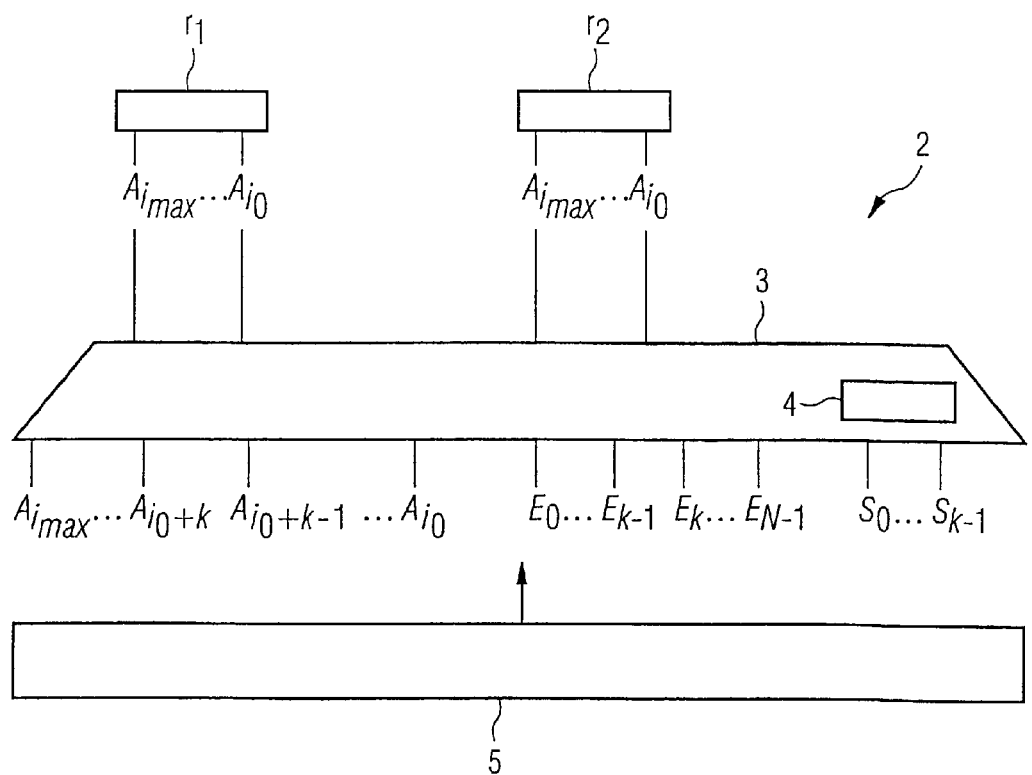

INTEGRATED MEMORY AND METHOD OF REPAIRING AN INTEGRATED MEMORY

BACKGROUND OF THE INVENTION

1. Field of the Invention

The invention lies in integrated memory technology field. More specifically, the present invention relates to an integrated memory having first units of memory cells and second, redundant units of memory cells for replacing first units of memory cells, and to a method for repairing such an integrated memory.

Integrated memories generally have redundant memory cells for repairing defective memory cells. The redundant memory cells are connected to redundant row lines or redundant column lines, which can replace corresponding regular lines with defective memory cells in address terms. The integrated memory is thereby tested by an external test unit, for example, and the redundant elements are subsequently programmed using a so-called redundancy analysis. A redundancy circuit has programmable elements, for example in the form of programmable fuses, which serve for storing the address of a line to be replaced.

A memory module is tested and repaired in the course of the fabrication process, for example. For this purpose, the addresses of those tested memory cells which were detected as defective are stored in a so-called defect address memory of the test unit in order, in a subsequent step, to replace these memory cells by defect-free redundant memory cells using the stored addresses. In this case, the memory module is generally subjected to a plurality of tests. In this case, only those memory cells which pass all the tests are deemed to be functional or defect-free. If a memory cell does not pass one or more tests, then it is deemed to be defective and must be replaced by a defect-free redundant memory cell. In the case of integrated memories having a matrix-type memory cell array which has row lines and/or column lines, instead of an individual memory cell an entire row or column line is usually replaced by corresponding redundant row or column lines.

A principle object in the fabrication of integrated memories is to fabricate memories of specific size more cost-effectively, that is to say to minimize the fabrication costs per memory chip. A considerable part of the fabrication costs is allotted to the test costs associated with the memory test, which generally rise proportionally with the required test time per wafer on which the memory circuits are arranged. There is great interest, therefore, in minimizing the test time per wafer.

The test time per wafer is generally determined by the number of tests used per memory chip, the parallelism, that is to say the number of chips which are tested simultaneously, and also by the test speed. An upper limit is placed on increasing the parallelism and test speed, however, inter alia due to the finite size of the fail memory tester's defect address memory in the form of an SDRAM memory which stores the addresses of defective memory cells for the purpose of a subsequent repair analysis used by customary automatic test machines, and the upper limit is virtually always fully exhausted in the case of present-day memory sizes.

A memory repair is often effected in such a way that a plurality of redundant rows or columns are simultaneously used for the repair. The term used in this case is so-called clustering. A number of redundant rows or columns is programmed as an associated cluster for replacing one or more normal rows or columns. In this way, a repair element is produced with a cluster size corresponding to the number of redundant rows or columns. A repair element having the cluster size X then comprises X rows or columns. By way of example, if SC is the storage capacitance of the memory chip and CR and CS is the cluster size of the redundant row and column repair elements, respectively, then the following holds true for the size of the fail bitmap per memory chip $$f = SC \cdot \frac{1}{CR} \cdot \frac{1}{CS}$$

wherein case the fail bitmap of the memory chip can be compressed by the compression factor $k=CR \cdot CS$ in repair-compatible fashion.

For a given size of the fail bitmap per chip f and a given fail memory size F of the test system, the number of memory chips which can be tested simultaneously is at most F/f. On the other hand, the size of the fail bitmap per memory chip f depends on the compression factor k, as explained above. It is evident from this that an increase in the cluster size leads to lower f, thus to higher parallelism and thus finally to a shorter test time. In addition, however, increasing the compression factor k generally also implies a reduction of yield, since a larger cluster size given the same number of redundant rows or columns leads to a reduction of the number of redundant repair elements. By way of example, if there are 48 redundant rows available, then 24 row repair elements are obtained therefrom with a cluster size of 2, whereas only 12 row repair elements are obtained with a cluster size of 4. Such a situation is critical primarily in an early process stage of the fabrication process, where it is customary to use every redundant element in order to actually exceed a specific yield limit.

SUMMARY OF THE INVENTION

It is accordingly an object of the invention to provide a method for repairing an integrated memory which overcomes the above-mentioned disadvantages of the heretofore-known devices and methods of this general type and which enables a comparatively short test time of the memory in conjunction with a yield that remains good. Furthermore, it is an object of the present invention to specify an integrated memory which enables a comparatively short test time in conjunction with a good yield.

With the foregoing and other objects in view there is provided, in accordance with the invention, a method of repairing an integrated memory having first units of memory cells and second, redundant units of memory cells for replacing respective first units of memory cells, the method which comprises:

functionally testing the first units of memory cells;
if a defect is ascertained in one of the first units, programming a number of redundant units as associated cluster for replacing one or more of the first units, and thereby forming a repair element with a cluster size corresponding to the number of redundant units; and
setting the cluster size of respective repair elements in a variable manner.

With the above and other objects in view there is also provided, in accordance with the invention, an integrated memory, comprising:

first units of memory cells and second, redundant units of memory cells for replacing respective the first units of memory cells;

a redundancy circuit for programming a number of redundant units as an associated cluster for replacing one or more of the first units, wherein a repair element is formed having a cluster size corresponding to the number of redundant units; and the redundancy circuit being configured to enable setting of the cluster size of respective the repair elements in a variable manner.

In other words, the invention is directed to a repair concept with repair elements of variable cluster size. In this case, the invention is based on the insight that a larger cluster size of repair elements is critical primarily in the early process stage of the fabrication process, while in contrast thereto, often only a fraction of repair elements is required in the late process stage. On the other hand, the length of the test time in the early product stage is only of minor importance, since a production line will generally have only little throughput here, while the test time in the later high-volume production is an extremely critical parameter. Consequently, it is optimal for the cluster size of the respective repair elements to be set in a variable manner during the repair of the memory. A minimal cluster size can be set in the early process stage, in order that there are sufficient repair possibilities available for the purpose of maximizing the yield, while a significantly increased cluster size is chosen in the later process stage, in order to attain maximum parallelism during testing. As a result, the yield and the test time can be optimized with respect to one another.

Compared with repair concepts with a fixed cluster size, the advantage is afforded that the respective specific advantages of a smaller cluster size and of an increased cluster size of the repair elements can be utilized in combination with one another. By contrast, it would be possible to provide a markedly large number of redundant elements in order thereby to realize a high number of redundant elements having a large cluster size. However, on account of an increased area requirement for the redundancy, this leads to an enlargement of the area requirement per chip and thus to a reduction of the number of memory chips per wafer, and is thus not a practicable means for minimizing the fabrication costs per memory chip.

Taking account of the above statements, in one embodiment of the method according to the invention, a first cluster size is set at a first point in time of a test and repair operation and a second cluster size, which is greater than the first cluster size, is set at a second, later point in time of the test and repair operation. The cluster size can also be varied in more than two stages, for example in three or four stages with a different cluster size in each case. As a result, the advantages both of a minimal and of an increased cluster size of repair elements are utilized in combination with one another. It is in this connection, in particular, that a further major advantage of a variable cluster size of repair elements is manifested: if, contrary to expectations, increasing the cluster size results in an excessively large dip in yield in the advanced product stage, that can be counteracted simply by reducing the cluster size again.

A further basic idea of embodiments of the present invention consists in the fact that from individual repair elements having a smaller cluster size, a repair element having a cluster size which is larger by a factor x in comparison therewith is constructed in such a way that the repair element having the larger cluster size is composed of x repair elements having the smaller cluster size which are arranged next to one another.

In accordance with an added feature of the invention, as defined in the appended claims, a first cluster size is set at a first point in time of operation and a second cluster size, which is greater than the first cluster size, is set at a later point in time of the operation.

In accordance with an additional feature of the invention, a repair element is constructed from individual repair elements of a smaller cluster size, to form a repair element having a larger cluster size that is larger by a factor x in comparison therewith. The repair element having the larger cluster size is composed of x repair elements having the smaller cluster size and being arranged next to one another.

In accordance with another feature of the invention, a cluster of first units of memory cells of a defined cluster size corresponding to the number of first units is replaced by respectively replacing the cluster with a plurality of repair elements each having a cluster size smaller in comparison therewith.

In accordance with a further feature of the invention:
the step of programming a respective repair element comprises addressing the repair element with an address and applying a repair address in the form of an address of an element to be replaced; and
when the cluster size is enlarged, parts of the address of the repair element and parts of the repair address are set in a predetermined manner.

The method may further comprise the following steps:
blocking at least one less-significant address bit of the address and of the repair address against external access;
applying a same signal to the at least one less-significant address bit of the address and of the repair address; and
releasing the repair elements that are addressed by identical more-significant address bits of the address for application of the repair address.

In accordance with again an added mode of operation, the method comprises:
functionally testing the first units of memory cells in clusters, and generating a common repair information item for a number of first units associated with a cluster;
generating a repair information item in each case for a plurality of tested clusters, compressing individual repair information items by logic combination to form a compressed repair information item, and forwarding the compressed repair information item to an output unit.

In accordance with again a further feature of the invention, the individual repair information items are generated serially for a plurality of tested clusters of first units and the compressed repair information item is generated by time division multiplexing of the individual repair information items.

In the integrated memory according to the invention, the memory cells are arranged, in accordance with a preferred feature of the invention, in a matrix memory cell array along rows and columns, and the first units of memory cells and the redundant units of memory cells are formed by a respective row or column.

In accordance with again another feature of the invention, for programming a respective the repair element, the repair element is addressed with an address and a repair address in the form of an address of an element to be replaced is applied to the redundancy circuit; and the redundancy circuit is configured such that, when the cluster size is enlarged, parts of the address of the repair element and parts of the repair address are set in a predetermined manner.

In accordance with yet another feature of the invention, the redundancy circuit comprises a multiplexer circuit with a control circuit, configured:

to block at least one less-significant address bit of the address and of the repair address against external access;

to apply a same signal to the at least one less-significant address bit of the address and of the repair address; and to release those repair elements that are addressed by identical more-significant address bits of the address, for application of the repair address.

In accordance with again a further feature of the invention, there is provided:

a test circuit for generating, when checking clusters with first units of memory cells, a common repair information item for a number of first units associated with a cluster;

a combination circuit connected to the test circuit for compressing a plurality of the repair information items to form a compressed repair information item; and an output unit to the combination circuit for outputting the compressed repair information item.

In accordance with a concomitant feature of the invention, the combination circuit has a multiplexing circuit for time division multiplexing of serially generated repair information items.

Other features which are considered as characteristic for the invention are set forth in the appended claims.

Although the invention is illustrated and described herein as embodied in a integrated memory and method for repairing an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1A and 1B are diagrams showing an embodiment of an integrated memory with a memory cell array with normal and with redundant rows and columns;

FIG. 2 is a flow diagram relating to a first exemplary embodiment of the invention;

FIG. 3 is a further flow diagram relating to the first exemplary embodiment of the invention;

FIG. 4 is a diagrammatic block diagram of an embodiment of an integrated memory according to the invention.

DESCRIPTION OF THE PREFERRED EMBODIMENTS

Figure 5:
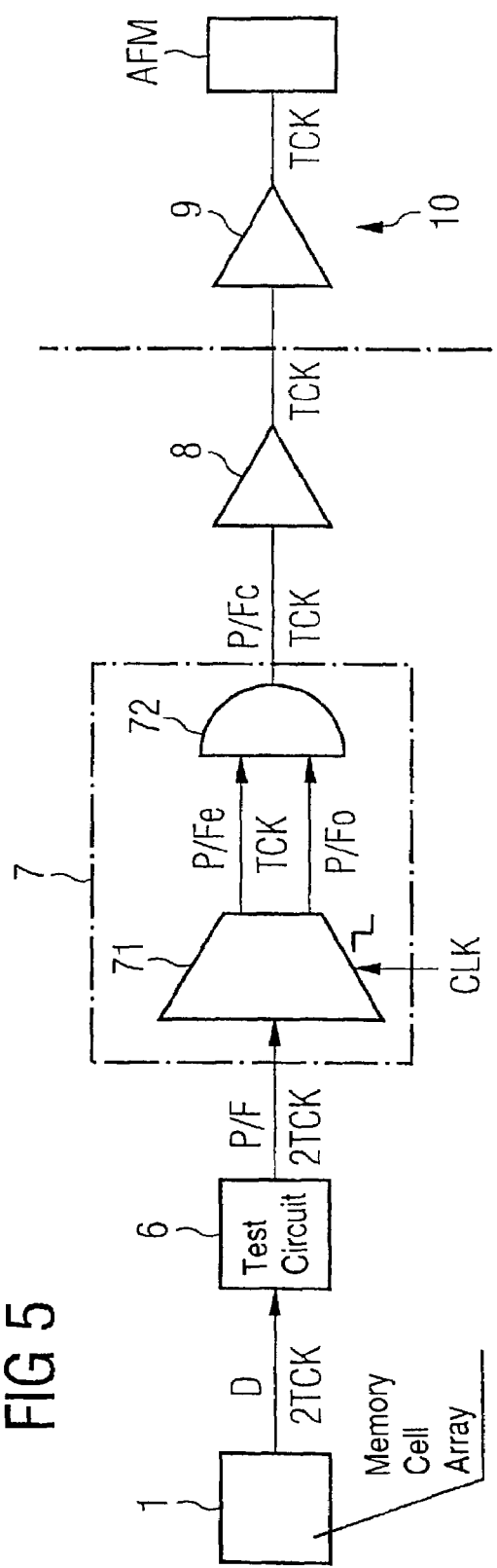
FIG. 5 is a block diagram of a further embodiment of an integrated memory according to the invention in interconnection with an external test unit.

Referring now to the figures of the drawing in detail and first, particularly, to FIG. 1A thereof, there is shown, in roughly diagrammatic fashion, a memory cell array 1 of an integrated memory. Memory cells MC are arranged at crossover points of row lines in the form of word lines WL and column lines in the form of bit lines BL. The memory shown by way of example additionally has redundant row lines in the form of redundant word lines RWL. A memory of this type usually additionally has redundant column lines in the form of redundant bit lines which, however, are not illustrated in FIG. 1A for the sake of clarity. The redundant word lines RWL serve for replacing regular word lines WL in the case of which a defect of one or more memory cells has been ascertained in a functional test. In the case of a memory of the type illustrated, instead of individual memory cells entire units of memory cells, here in the form of entire rows WL, are replaced by corresponding redundant units in the form of redundant rows RWL.

In the case of the present memory, a repair is effected in such a way that a plurality of redundant rows are simultaneously used for the repair. The term used in this case is clustering, a number of redundant rows, RWL1 and RWL2 in the example, forming an associated repair element r with a cluster size corresponding to the number of redundant rows, the size 2 in the example.

In the case of the present memory in accordance with FIG. 1, the cluster size of the respective repair elements can be set in a variable manner. By way of example, a repair element RE which is enlarged compared with the repair element r can be formed in the form of a row quadruple with four redundant rows RWL. A repair element having the cluster size 4 is thus produced. In this case, with the present memory, four repair elements are available, while eight repair elements are accordingly available with repair elements r having the cluster size 2.

As illustrated diagrammatically, in particular, with reference to FIG. 1B, in a method for repairing the integrated memory, the regular rows WL are tested in clusters c1 and c2 with regard to their functionality. For the case where a defect is ascertained in the row WL1, the cluster c2 having the cluster size 2 is replaced by a repair element r2, likewise having the cluster size 2. On the other hand, if the regular rows are tested in clusters CE having the cluster size 4, then, in the case of a defect in the row WL1, the rows associated with the cluster CE are replaced by the repair element RE1 likewise having the cluster size 4. As can be gathered from FIG. 1b, from individual repair elements having the cluster size 2, a repair element RE1 with a cluster size 4 which is larger by the factor 2 in comparison therewith is constructed in such a way that the repair element RE1 is composed of the two repair elements r1, r2 arranged next to one another.

A first exemplary implementation of the invention is explained in more detail below with reference to FIGS. 2 to 4.

Only row and column cluster sizes of the form CR $(i)=2^i$ and CS $(j)=2^j$ (that is to say powers of 2) are respectively considered here. Let R be the number of redundant rows and S the number of redundant columns. A redundancy configuration with $R/2^i$ row clusters having the size $2^i$ and $S/2^j$ column clusters having the size $2^j$, respectively, is symbolized by Red $(i, j, R/2^i, S/2^j)$ in FIGS. 2 and 3. In this case, a redundancy configuration is understood only to mean the information about the redundancy architecture of the memory chip which is used by the redundancy analyzer for calculating the repair solution. The redundancy configuration contains, inter alia, information about the number of redundant rows and columns, the length of the repair elements and cluster size. The redundancy configuration can thus perfectly well describe a different redundancy architecture than that realized in reality on the memory chip. By way of example, the memory chip may have an architecture which provides a repair in row pairs. However, if there is to be a transition from pair repair to quadruple repair, a (hypothetical) redundancy configuration with quadruples must be prescribed for the redundancy analyzer, even though the memory chip is repaired with pairs in reality.

As outlined in FIG. 2, as early as during the testing of the memory chip it is necessary to know the redundancy configuration Red (i, j, R/$2^i$, S/$2^j$) (that is to say in this case, in particular, the size and number of the row or column clusters), in order to be able to carry out the redundancy-compatible compression and to know the corresponding space requirement f of the fail bitmap of the memory chip. For the case where it is possible to repair the chip with the given redundancy configuration, the repair analysis effected after a test operation supplies those row or column addresses which have to be repaired. In the case of row or column cluster sizes $2^i$ or $2^j$, respectively, these addresses have the form $X_{imax} \ldots X_i$ or, respectively, $Y_{jmax} \ldots Y_j$ ($X_k, Y_l \in \{0, 1\}$), provided that the fail bitmap of the memory chip is compressed in a repair-compatible manner.

Let $2^{i0}$ and $2^{j0}$ be the minimum cluster sizes compatible with a so-called fuse concept of the memory, which, depending on the redundancy architecture and fuse concept of the memory chip, are not necessarily equal to 1 (in other words, i0 and j0 are not necessarily equal to 0). Fuses which are provided on the memory and which represent programmable elements, for example in the form of electrically programmable elements, serve for storing the address of an element to be replaced. They are usually part of a corresponding redundancy circuit of the memory chip. The fuse concept of the present memory chip actually demands a use of the redundancy concept Red (i0, j0, R/$2^{i0}$, S/$2^{j0}$), since the so-called fuse converter for programming the fuses can only process repair solutions Rep (i0, j0, R/$2^{i0}$, S/$2^{j0}$) with repair addresses of the form $X_{imax} \ldots X_{i0}$ and $Y_{jmax} \ldots Y_{j0}$. The general statements with respect to the redundancy configuration Red ( ) apply analogously to the selected representation of the repair solutions in the form of Rep ( ).

For i>i0 or j>j0, it is now possible, however, to realize any cluster size $2^i$ or $2^j$ of the repair elements (if R is divisible by $2^i$ or S by $2^j$, which is assumed here), by using the redundancy concept Red (i, j, R/$2^i$, S/$2^j$) and generating a set of $2^{i-i0}$ row addresses or $2^{j-j0}$ column addresses from each row or column repair address $X_{imax} \ldots X_i$ or $Y_{jmax} \ldots Y_j$, respectively, of the resulting repair solution Rep (i, j, R/$2^i$, S/$2^j$) as follows:

$X_{imax} \ldots X_{i0} \rightarrow X_{imax} \ldots X_i (2^{i-i0}-1)$ bin, ..., $X_{imax} \ldots X_i (0)_{bin}$, and $Y_{jmax} \ldots Y_{j0} \rightarrow Y_{jmax} \ldots Y_j (2^{j-j0}-1)$ bin, ..., $Y_{jmax} \ldots Y_j (0)_{bin}$, where $(n)_{bin}$ is the binary representation of the natural number n.

This construction means that the replacement of a cluster of regular rows of a defined cluster size (for example CE in FIG. 1) is effected by respective replacement with a plurality of repair elements each having a cluster size that is smaller in comparison therewith (for example r1, r2 in FIG. 1). Each repair of a row element having the cluster size $2^i$ is thus generated by $2^{i-i0}$ repairs with row elements having the cluster size $2^{i0}$. By analogy, each repair of a column element having the cluster size $2^j$ is generated by $2^{j-j0}$ repairs with column elements having the cluster size $2^{j0}$. The flow diagram in accordance with FIG. 2 is thus modified in accordance with the flow diagram according to FIG. 3.

A circuitry realization for the case where repair elements are programmed by means of electrically programmable fuses is described in more detail below with reference to FIG. 4.

For the sake of simplicity, a distinction between redundant row and column elements is no longer made here, rather only redundant elements are used as a basis. These then stand for either row or column elements. The embodiment explained further below consists essentially in realizing the combination of elements to be repaired with redundant elements by electrically programmable fuses. In the present exemplary embodiment, it is assumed that L=$2^N$ redundant elements having the minimum cluster size $2^{i0}$ are present. A respective repair element is programmed in such a way that it is addressed by means of an address $E_0 \ldots E_{N-1}$ and a repair address $A_{imax} \ldots A_{i0}$ is applied in the form of an address of an element to be replaced. Thus, a repair element is always released by the address $E_0 \ldots E_{N-1}$ for programming with repair address $A_{imax} \ldots A_{i0}$.

The address of the repair element and the repair address are applied to a redundancy circuit 2. In this case, said addresses are generated by a redundancy analysis unit 5. For its part, the redundancy circuit 2 has a multiplexer circuit 3 and a control circuit 4. The multiplexer circuit 3 is designed in conjunction with the control circuit 4 for programming $2^N$ repair elements having the cluster size $2^{i0}$ in such a way that $2^{N-k}$ repair elements having the cluster size $2^{i+k}$ are obtained, where it is necessary that k≦N.

The control circuit 4 is controlled by control signals $S_j$, where j=0, ..., k-1. In this case, the control circuit is controlled by said control signals in such a way that at least one less-significant address bit of the address of one of the repair elements and of the repair address is blocked against external access. Specifically, this means that the address bits $A_{j+i0}$ and $E_j$ are blocked against external access. Afterward, the same signal is applied to the at least one less-significant address bit of the address of the repair element and of the repair address. This means that $A_{j+i0}=E_j$. Afterward, those repair elements which are addressed by identical more-significant address bits $E_k \ldots E_{N-1}$ are released for the application and programming of the repair address $A_{imax} \ldots A_{i0+k}$.

As a result, a circuit is obtained which, when the cluster size is enlarged, allows parts of the address of the repair element and parts of the repair address which are no longer required on account of the enlargement of the cluster size (a reduction of the address spaces follows from this) to be set in a predetermined manner. Consequently, it is possible to shorten the duration of the redundancy addressing performed on chip.

It follows from the exemplary embodiment explained above that the $2^k$ repair elements which are addressed by the addresses $E_0 \ldots E_{k-1}$ are used simultaneously (as cluster having the size $2^{i0+k}$) for the repair, the lower part of the repair address $A_{i0+k-1} \ldots A_{i0}$ for each repair element being defined by the addressing $E_0 \ldots E_{k-1}$ thereof. The upper part of the repair address $A_{imax} \ldots A_{i0+k}$ is supplied in a conventional manner by the redundancy analyzer which, in the case of cluster enlargement, operates with a compressed fail bitmap (which need not take account of the addresses $A_{i0+k-1} \ldots A_{i0}$)

A concrete numerical example is explained in more detail below in order to again illustrate the above exemplary embodiment of the invention.

For the sake of simplicity, redundant columns are dispensed with and it is assumed that the memory has R=16 redundant rows which can be used in pairs for the repair of defective rows. In other words, the minimum row cluster size to be compatible with the fuse concept is c (i0)=2 (that is to say: $2^{i0}$=2, i0=1). There is thus present with regard to the abovementioned redundancy configuration Red (i0, j0, $R/2^{i0}$, $S/2^{j0}$) where $i0=1$, $R=16$, $S=0$. It is further assumed that the memory has $8192=2^{13}$ rows, in other words 13 address bits of a row address $X_{12}X_{11} \ldots X_1X_0$. Twelve fuse address bits $F^r_{12}F^r_{11} \ldots F^r_1$ are required for each row repair element r having the cluster size 2 ($r=1, \ldots, 8$), and the row defect addresses $X_{12}X_{11} \ldots X_1$ to be stored likewise comprise twelve bits. Since repair is effected in pairs, one address bit can be saved in comparison with the row address having 13 bits.

Proceeding from this situation, it is now possible to increase the cluster size of the redundant rows from 2 to c (i)=4 (that is to say i=2), 8 (i=3) or 16 (i=4), by artificially combining two pairs to form a 4-tuple or four pairs to form an 8 tuple or eight pairs to form a 16 tuple. In this case, the number of redundant repair elements decreases from 8 to 4 or 2 or 1, respectively. The cluster size c (i) times the number of redundant row elements having precisely this cluster size must always be equal to 16. In this case, the number of address bits of the row defect addresses to be stored changes from originally 12 (in the case of the pairs) to 11 (in the case of the 4-tuples) or 10 (in the case of the 8 tuples) or 9 (in the case of the 16 tuples).

We will now consider the case where, instead of pairs, 4-tuples are to be used for the repair. In other words, the cluster size is enlarged. Thus, only four repair elements (having the cluster size c (2)=4) are then obtained and 11 address bits $X_{12}X_{11} \ldots X_2$ must be stored per row defect address. In this case, the redundancy analysis unit which examines the totality of the defect addresses to determine whether or not the memory is repairable operates with defect addresses $X_{12}X_{11} \ldots X_2$ having a length of 11 bits instead of $X_{12}X_{11} \ldots X_1$ having a length of 12 bits. This means that the repair solution which is calculated by the redundancy analysis unit (in the case where this exists) comprises addresses to be repaired (that is to say to be fused) which have a length of 11 bits.

If it is assumed, by way of example, that the address $x^0_{12}X^0_{11} \ldots X^0_2$ exists in the repair solution, that is to say that the four rows with the addresses $X^0_{12}X^0_{11} \ldots X^0_2 11$, $X^0_{12}X^0_{11} \ldots X^0_2 10$, $X^0_{12}X^0_{11} \ldots X^0_2 01$ and $X^0_{12}X^0_{11} \ldots X^0_2 00$ have to be replaced by two redundant row pairs r1 and r2. This is achieved by programming the redundant row pair r1 to the address $X^0_{12}X^0_{11} \ldots X^0_2 0$ and the redundant row pair r2 to the address $X^0_{12}X^0_{11} \ldots X^0_2 1$. Row pair r1 then repairs the addresses $X^0_{12}X^0_{11} \ldots X^0_2 01$ and $X^0_{12}X^0_{11} \ldots X^0_2 00$; on the other hand, row pair r2 repairs the addresses $X^0_{12}X^0_{11} \ldots X^0_2 11$ and $X^0_{12}X^0_{11} \ldots X^0_2 10$. A 4-tuple has been artificially generated from the two pairs r1 and r2.

FIG. 5 illustrates a further embodiment of an integrated memory according to the invention, which is interconnected with an external test unit 10. The memory has a test circuit 6, which is connected to the memory cell array 1 for the read-out of test data D. The data D are transmitted with a double clock frequency 2TCK. The test circuit 6 compares the data D read from the memory cell array 1 with an expected value and generates a repair information item P/F. A compression in accordance with the (minimum) cluster size can already be carried out in this case.

An arbitrary data compression of the cluster size that is effective (for the test system) can be obtained by the repair information items of the individual (actually small) clusters already being compressed by logic combination on the chip. In other words, the individual repair information items P/F obtained for a plurality of tested clusters are compressed by logic combination to form a compressed repair information item P/Fc, which, in accordance with FIG. 5, is carried out with the aid of a combination circuit 7 connected to the test circuit 6. The combination circuit 7 having a multiplexer 71 and an OR gate 72 is connected, for its part, to an output unit 8 for outputting the compressed repair information. The output unit 8, for example in the form of a driver, is connected to a corresponding receiver circuit 9 of the test unit 10 which forwards the compressed repair information to a defect address memory AFM of the test unit 10.

In the present exemplary embodiment, the individual repair information items for the plurality of tested clusters are obtained as so-called pass/fail information items for each cluster in serial form. In this case, the compressed repair information item P/Fc is generated by time division "multiplexing" of the individual repair information items P/F with the aid of a corresponding multiplexing circuit, under the control of the clock signal CLK. This affords the advantage that, given a constant test speed on the memory chip, the data rate to the external test unit is simultaneously reduced. Conversely, given a constant data rate to the test unit, the effective test speed on the memory chip can be multiplied. The exemplary embodiment according to FIG. 5 shows an exemplary realization for a doubling of the column cluster size. It consists in time division "multiplexing" with logic ORing of the obtained pass/fail information item P/F of two successively tested individual clusters (for example c1, c2 in FIG. 1). The compressed cluster (corresponding to CE in FIG. 1) is "fail" if an arbitrary or both tested individual clusters are "fail."

For the sake of simplicity, a so-called double data rate (DDR) memory chip was used here wherein, for doubling the column cluster size, two successive bits P/Fe, P/Fo (even and odd) of a repair information item P/F are combined with one another within a read burst. A doubling of the cluster size simultaneously leads to a halving of the size of the fail bitmap F required per memory chip and also to a possible doubling of the test frequency without adversely affecting a so-called speed factor V. Depending on the test speed, effectively not all the fail memory of the tester is available under certain circumstances. This circumstance is generally taken into account by means of a speed factor V. Accordingly, the equation mentioned in the introduction is supplemented to give $$f = SC \cdot \frac{1}{CR} \cdot \frac{1}{CS} \cdot V.$$

Above a specific data rate, V>1.

Doubling the cluster size enables the data compression to be doubled. In addition to the smaller size of the fail bitmap required, the data rate is also halved. As a result, the test frequency can be doubled without adversely affecting the speed factor V and, consequently, the test productivity can be quadrupled.

A generalization of the invention's concept of variable cluster sizes to arbitrary cluster sizes and memory protocols (for example single data rate, double data rate, etc.) is possible without difficulty.

We claim:

1. A method of repairing an integrated memory having first units of memory cells and second, redundant units of memory cells for replacing respective first units of memory cells, the method which comprises:
    functionally testing the first units of memory cells;
    if a defect is ascertained in one of the first units, programming a number of redundant units as associated cluster for replacing one or more of the first units, and thereby forming a repair element with a cluster size corresponding to the number of redundant units;

setting the cluster size of respective repair elements in a variable manner;

carrying out the step of programming a respective repair element by addressing the repair element with an address and applying a repair address in the form of an address of an element to be replaced; and when the cluster size is enlarged, setting parts of the address of the repair element and parts of the repair address in a predetermined manner.

2. The method according to claim 1, which comprises setting a first cluster size at a first point in time of an operation and setting a second cluster size, which is greater than the first cluster size, at a second, later point in time of the operation.

3. The method according to claim 1, which comprises constructing from individual repair elements having a smaller cluster size a repair element having a larger cluster size that is larger by a factor x in comparison therewith, such that the repair element having the larger cluster size is composed of x repair elements having the smaller cluster size and being arranged next to one another.

4. The method according to claim 1, which comprises replacing a cluster of first units of memory cells of a defined cluster size corresponding to the number of first units by respectively replacing the cluster with a plurality of repair elements each having a cluster size smaller in comparison therewith.

5. The method according to claim 1, which comprises:
blocking at least one less-significant address bit of the address and of the repair address against external access;
applying a same signal to the at least one less-significant address bit of the address and of the repair address; and
releasing the repair elements that are addressed by identical more-significant address bits of the address for application of the repair address.

6. The method according to claim 1, which comprises:
functionally testing the first units of memory cells in clusters, and generating a common repair information item for a number of first units associated with a cluster;
generating a repair information item in each case for a plurality of tested clusters, compressing individual repair information items by logic combination to form a compressed repair information item, and forwarding the compressed repair information item to an output unit.

7. The method according to claim 6, which comprises generating the individual repair information items serially for a plurality of tested clusters of first units and generating the compressed repair information item by time division multiplexing of the individual repair information items.

8. An integrated memory, comprising:
first units of memory cells and second, redundant units of memory cells for replacing respective said first units of memory cells;
a redundancy circuit for programming a number of redundant units as an associated cluster for replacing one or more of said first units, wherein a repair element is formed having a cluster size corresponding to the number of redundant units, said repair element being addressed with an address and a repair address in the form of an address of an element to be replaced being applied to said redundancy circuit, for programming a respective said repair element; and
said redundancy circuit being configured to enable setting of the cluster size of respective said repair elements in a variable manner and said redundancy circuit being configured such that, upon the cluster size being enlarged, parts of the address of said repair element and parts of the repair address being set in a predetermined manner.

9. The integrated memory according to claim 8, wherein said memory cells are arranged in a matrix memory cell array along rows and columns, and said first units of memory cells and said redundant units of memory cells are formed by a respective row or column.

10. The integrated memory according to claim 8, wherein:
said redundancy circuit comprises a multiplexer circuit with a control circuit, configured to
block at least one less-significant address bit of the address and of the repair address against external access;
apply a same signal to the at least one less-significant address bit of the address and of the repair address; and
release those repair elements that are addressed by identical more-significant address bits of the address, for application of the repair address.

11. The integrated memory according to claim 8, which comprises:
a test circuit for generating, when checking clusters with first units of memory cells, a common repair information item for a number of first units associated with a cluster;
a combination circuit connected to said test circuit for compressing a plurality of the repair information items to form a compressed repair information item; and
an output unit to said combination circuit for outputting the compressed repair information item.

12. The integrated memory according to claim 11, wherein said combination circuit has a multiplexing circuit for time division multiplexing of serially generated repair information items.

* * * * *